United States Patent [19]

Igura et al.

[11] Patent Number: 5,703,280
[45] Date of Patent: Dec. 30, 1997

[54] METHOD AND APPARATUS FOR CHECKING WATERPROOF CONNECTORS FOR WATERPROOFNESS

[75] Inventors: Toshinori Igura; Masaru Fukuda, both of Shizuoka, Japan

[73] Assignee: Yazaki Corporation, Tokyo, Japan

[21] Appl. No.: 752,600

[22] Filed: Nov. 19, 1996

Related U.S. Application Data

[62] Division of Ser. No. 601,398, Feb. 14, 1996.

[30] Foreign Application Priority Data

Feb. 17, 1995 [JP] Japan ................................. 7-029139
Aug. 2, 1995 [JP] Japan ................................. 7-197686

[51] Int. Cl.$^6$ ................................................ G01M 3/04
[52] U.S. Cl. ................... 73/40; 73/49.2; 439/310; 439/912
[58] Field of Search .................... 73/40, 49.2; 439/310, 439/912; 29/593

[56] References Cited

U.S. PATENT DOCUMENTS

| | | |
|---|---|---|
| 3,340,723 | 9/1967 | Harris et al. ................................. 73/40 |
| 3,529,463 | 9/1970 | Orlando et al. ................................. 73/49.2 |
| 4,232,262 | 11/1980 | Emo et al. . | |
| 4,658,212 | 4/1987 | Ozawa et al. . | |
| 4,799,377 | 1/1989 | Strong et al. ................................. 73/40 |

FOREIGN PATENT DOCUMENTS 64-27668  2/1989  Japan .

*Primary Examiner*—Hezron E. Williams
*Assistant Examiner*—Daniel S. Larkin
*Attorney, Agent, or Firm*—Armstrong, Westerman, Hattori, McLeland & Naughton

[57] ABSTRACT

A waterproof connector is checked for waterproofness, which waterproof connector has a terminal-accommodating chamber into which a terminal is inserted and which is sealed with a waterproofing rubber stopper through which an insulated wire attached to the terminal passes. A connector-holding block of a waterproofness-checking jig engages in a watertight manner with the connector-fitting side of the waterproof connector, followed by depressurizing the waterproof connector with an ejector and comparing the pressure inside the waterproof connector with a reference pressure to determine the presence or non-presence of a leakage. Owing to the depressurization of the waterproof connector, the terminal, if inserted incomplete, is moved into a fully-inserted position in the connector housing in one piece with the waterproofing rubber stopper. A waterproof connector can be easily and reliably checked for waterproofness without making errors, while remedying incomplete insertion of a terminal.

4 Claims, 6 Drawing Sheets

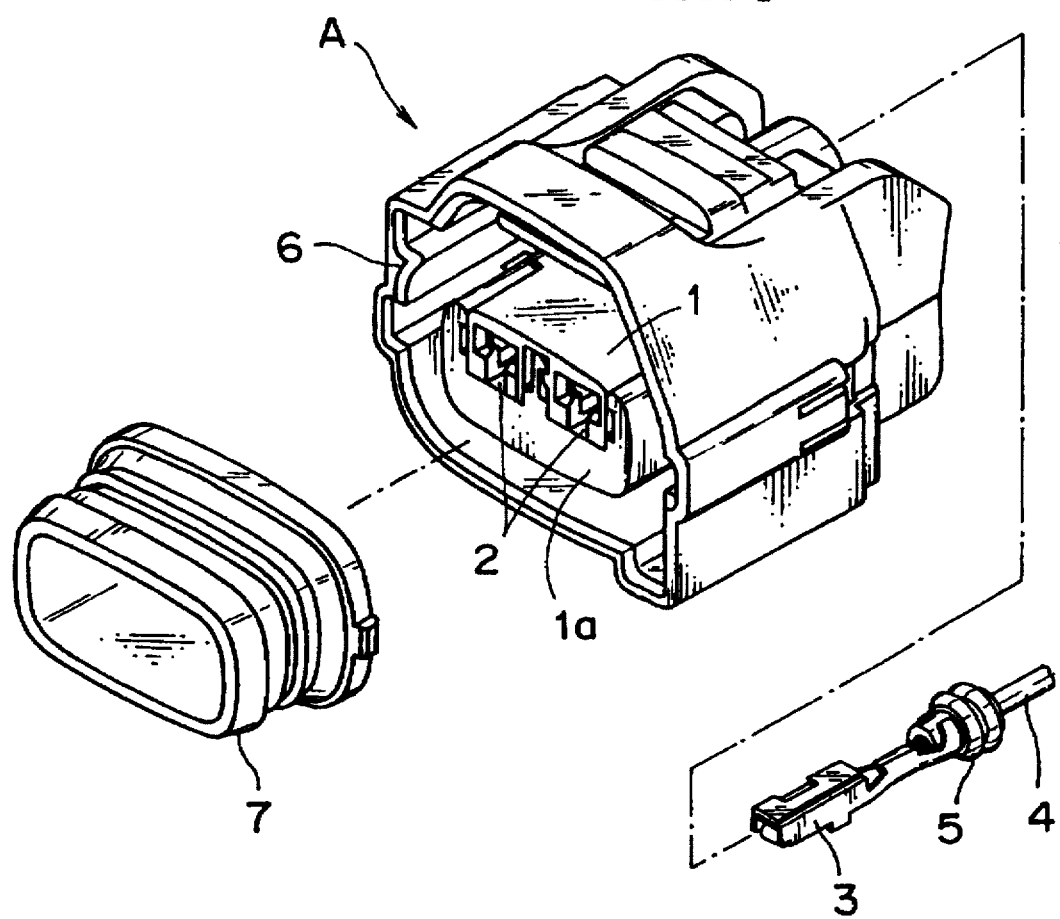

METHOD AND APPARATUS FOR CHECKING WATERPROOF CONNECTORS FOR WATERPROOFNESS

This application is a divisional application of application Ser. No. 08/601,398 filed on Feb. 14, 1996.

BACKGROUND OF THE INVENTION

1. Field of the Invention

This invention relates to a method, apparatus and jig for checking the waterproofness of a waterproof connector, by which a waterproof connector—which is used for the mutual connection of wiring harnesses and the like—can be checked for waterproofness, while at the same time incomplete insertion of a terminal into the connector is prevented.

2. Description of the Related Art

A waterproof connector generally has a construction as shown in FIG. 8. In other words, a waterproof connector A has a synthetic resin-made housing body 1 in which a plurality of divided terminal-accommodating chambers (terminal-accommodating holes) are formed. A metallic female terminal 3 is inserted into each accommodating chamber from the rear to be locked therein. The female terminal 3 is crimped on and attached to the end of an insulated wire 4 together with a waterproofing rubber stopper 5. The outer periphery of the rubber stopper 5 elastically contacts the inner wall of a related accommodating chamber 2 to provide a waterproof seal. The housing body 1 is around its outer periphery provided with a waterproofing hood 6 and is fitted through a rubber packing 7 with a mating connector (not shown).

The waterproofness of the waterproof connector A will be adversely affected if the rubber stopper 5 is not present, improperly set or faulty, or if the connector housing itself (housing body 1, waterproofing hood 6) is faulty.

Referring to FIG. 9, which is a block diagram of a conventional system for waterproofness checking, a pressure source 11 comprised of a compressor or compressed air is branched through a regulator 12 to be connected to a waterproofness checking jig 13 and to a pressure sensor 14. To the pressure sensor 14 a display 15 is connected as an output device. Designated at 16 is an air pipeway.

To check for waterproofness, the waterproof connector A is set on the waterproofness-checking jig 13 in a watertight manner, followed by applying through the regulator 12 a predetermined pressure (positive pressure). The level of pressure inside the connector A is read (judged) by the pressure sensor 14, and its result is displayed on the display 15, while at the same time compared with a reference pressure stored in advance to output its result, for example, as a buzzer (alarm).

There are, however, various drawbacks to the conventional method in which pressurized air is supplied to the waterproof connector A. First, since the pressure inside the connector is susceptible to a change in temperature and the like, even if the seal between the rubber stopper 5 and the related terminal-accommodating chamber 2 and between the rubber stopper 5 and the insulator of the insulated wire 4 is complete, the pressure inside the connector turns positive or negative as compared with the atmospheric pressure, making it difficult to accurately check. Second, since the waterproof connector is applied with a positive pressure, if the setting of the connector A on the checking jig 13 or the insertion of the rubber stopper 5 is incomplete, there is a fear that these elements will pop out. Third, much skill is required in quickly setting the waterproof connector in a watertight manner on the checking jig, and in case such poping-out as mentioned above takes place, it is necessary to reset what has popped out. As a result, much time is required as a whole before completion of the checking.

FIG. 10 shows a method according to which the above-referenced waterproof connector A is checked for continuity, which method is disclosed in Japanese Utility Model Application Laid-Open Specification No. Sho 64-27668. In this method, continuity is checked as follows. A spring-urged conductive pin (proving pin) 81 is at the front end pressed against the front end of the terminal 3 in the waterproof connector A and at the rear end contacted with an electrode 82, while a lead wire 83 with a lamp 84 is connected between the terminal 3 and the electrode 82 so that the continuity is checked by the lighting of the lamp 84. In this instance, if the terminal 3 is in an incompletely inserted position in the waterproof connector A, i.e., if a resilient locking lance 85 of the housing 1 is not engaged in the engagement hole (not shown) of the terminal 3, as the waterproof connector A is moved in the direction of the conductive pin 81, the terminal 3 is pushed to the outside so that its incomplete insertion will be detected.

There is, however, a drawback to this method of checking for continuity that, in the case where the engagement hole of the terminal 3 stops just in front of the locking lance 85, i.e., just before engagement, and where the terminal 3 is hard to move due to crooking of the insulated wire 4 in a lateral direction or the like, the terminal 3 is not pushed out even when pressed by the conductive pin 81, resulting in non-detectability of an incompletely-inserted terminal.

SUMMARY OF THE INVENTION

This invention has been accomplished to overcome the above drawbacks and an object of this invention is to provide a method of checking the waterproofness of a waterproof connector, by which method such checking can be reliably, safely and quickly done, while at the same time incomplete insertion of a terminal in the waterproof connector can be prevented, and an apparatus and jig therefor.

In order to attain the object, according to an aspect of this invention, there is provided a method of checking a waterproof connector for waterproofness comprising a connector housing with a terminal-accommodating chamber formed therein into which a terminal attached to an end of an insulated wire has been inserted from a first side of the connector housing, the terminal-accommodating chamber having been sealed by a waterproofing rubber stopper through which the insulated wire passes, the method comprising the steps of: engaging a connector-holding block in a watertight manner with a second side of the connector housing at which the connector is fitted with a mating connector; depressurizing an interior of the connector through the connector-holding block; and detecting and comparing a pressure inside the connector with a reference pressure preset to determine presence or non-presence of leakage.

In the above method, since the waterproof connector is depressurized through the connector-holding block, unlike the conventional method in which the connector is pressurized, there is no fear that the waterproofing rubber stopper may pop out. Rather, the waterproofing rubber stopper, if inserted incomplete, is attracted under reduced pressure to a fully-inserted position in the connector housing. As a result, it becomes possible to quickly determine the waterproofness of the connector.

According to another aspect of this invention, there is provided an apparatus for checking a waterproof connector for waterproofness, comprising: a waterproofness checking jig provided with a connector-holding block for engaging and holding in a watertight manner a fitting side of the connector with a mating connector; means for depressurizing an interior of the connector through the connector-holding block and means for holding the interior of the connector in the depressurized state; means for detecting a pressure inside the connector a certain period of time after commencement of holding in the depressurized state and comparing the same with a reference pressure preset to determine presence or non-presence of leakage; and means for displaying the detected pressure inside the connector and the presence or non-presence of leakage.

In the above apparatus which is for carrying out the checking method as described above, since the connector-holding block engages and holds in a watertight manner the fitting side of the connector with a mating connector, the setting of the connector for waterproofness checking can be easily and reliably conducted. Owing to this as well as to the determining means and the displaying means which enable quick judgement of the waterproofness of the connector, the checking can be done rapidly as a whole.

According to a further aspect of this invention, there is provided a waterproofness checking jig for holding a waterproof connector comprising a connector housing with a terminal-accommodating chamber formed therein into which a terminal attached to an end of an insulated wire has been inserted from a first side of the connector housing, the terminal-accommodating chamber having been sealed by a waterproofing rubber stopper through which the insulated wire passes, the waterproofing checking jig-comprising: a framing; a sub-holding block provided at one end of the framing for supporting the first side of the connector; a connector-holding block provided slidable between the sub-holding block and the other end of the framing for engaging and holding in a watertight manner a second side of the connector at which the connector is fitted with a mating connector; an air pipeway connected-to the connector-holding block for depressurizing and pressurizing the connector through the connector-holding block; and a rotatable lever provided with a toggle mechanism for moving the connector-holding block forwardly and backwardly between the sub-holding block and the other end of the framing.

In the checking jig of the above construction, if the lever is rotated with the terminal-insertion side of the connector supported on the sub-holding block, the connector-holding block engages in a watertight manner with the connector-fitting side of the connector through the toggle mechanism, making it possible for an inexperienced worker to set the connector easily, quickly and reliably and perform the checking with few errors.

According to yet a further aspect of this invention, there is provided a method of checking a waterproof connector for waterproofness comprising a connector housing with a terminal-accommodating chamber formed therein into which a terminal attached to an end of an insulated wire has been inserted from a first side of the connector housing, the terminal-accommodating chamber having been sealed by a waterproofing rubber stopper through which the insulated wire passes, the method comprising the steps of: engaging a connector-holding block in a watertight manner with a second side of the connector housing at which the connector is fitted with a mating connector; and depressurizing an interior of the connector through the connector-holding block, wherein during the depressurization of the interior of the connector, the terminal, if inserted incomplete, is sucked in one piece with the waterproofing rubber stopper into a fully-inserted position.

According to yet a further aspect of this invention, there is provided an apparatus for checking a waterproof connector for waterproofness comprising a connector housing with a terminal-accommodating chamber formed therein into which a terminal attached to an end of an insulated wire has been inserted from a first side of the connector housing, the terminal-accommodating chamber having been sealed by a waterproofing rubber stopper through which the insulated wire passes, the apparatus comprising: a waterproofness checking jig having a connector-holding block for engaging in a watertight manner with a second side of the connector at which the connector is fitted with a mating connector; and means for depressurizing an interior of the connector through the connector-holding block and means for holding the interior of the connector in the depressurized state, wherein during depressurization of the interior of the connector, the terminal, if inserted incomplete, is sucked in one piece with the waterproofing rubber stopper into a fully-inserted position.

In the above method as well as in the above apparatus, owing to the depressurization of the waterproof connector for checking for waterproofness, the terminal, if inserted incomplete, is attracted in the terminal-insertion direction and moved in one piece with the waterproofing rubber stopper into a fully-inserted position. Consequently, the incomplete insertion of the terminal is remedied.

The above and other objects, features and advantages of this invention will become apparent from the following description and the appended claims, taken in conjunction with the accompanying drawings.

BRIEF DESCRIPTION OF THE DRAWINGS

FIG. 8 is an explanatory view of a conventional waterproof connector;

DESCRIPTION OF THE PREFERRED EMBODIMENT

Embodiments of this invention will now be described with reference to the attached drawings.

Figure 1:
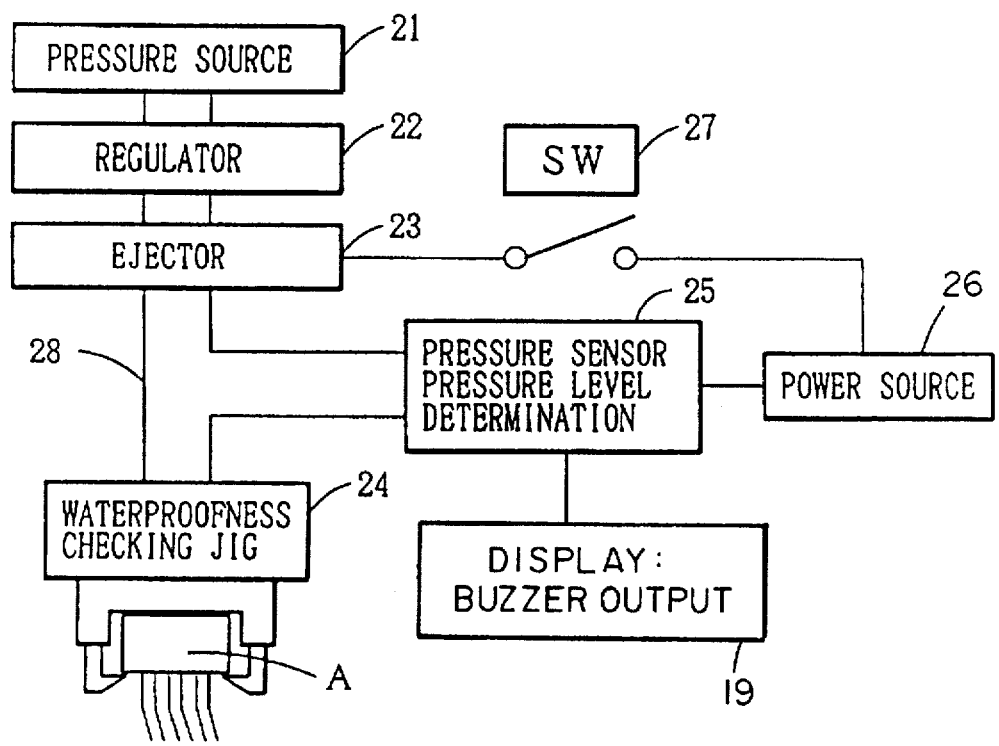
FIG. 1 is a system block diagram for explaining a method of checking a connector for waterproofness according to this invention.
Figure 9:
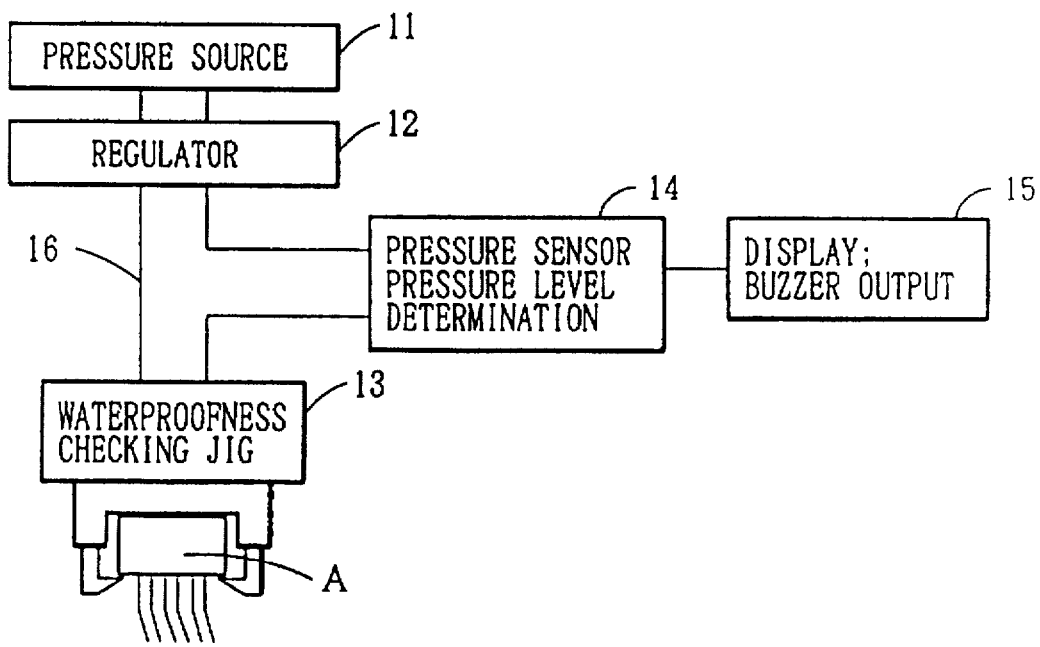
FIG. 9 is a system block diagram for explaining a conventional method for checking a connector for waterproofness.

Referring to FIG. 1, a compressor or compressed air constituting a pressure source 21 is connected through an air pipeway 28 to a regulator 22 to be regulated at a predetermined pressure, e.g. 5.0 kg/cm2. The regulator 22 is connected to an ejector (a changing valve for changing a pressure from positive to negative) 23 to depressurize to a predetermined pressure. A waterproofness checking jig 24 and a pressure sensor 25 are connected in a branched manner to the ejector 23, on which waterproofness checking jig 24 is set a waterproof connector A in a watertight manner as later described. The pressure sensor 25 has a function of detecting and displaying the pressure in the waterproof connector A set on the waterproofness checking jig 24 as well as a function of comparing the detected pressure with a preset reference pressure to judge whether the waterproof connector A is good and displaying the result of the judgement. The result of the judgement is indicated, for example, on a display 19 or by a buzzer.

Designated at 26 is a power source with a switch 27. If the switch 27 is turned on, the ejector 23 is operated to depressurize the waterproofness checking jig 24, and the pressure therein is displayed and judged by the pressure sensor 25.

Figure 2:
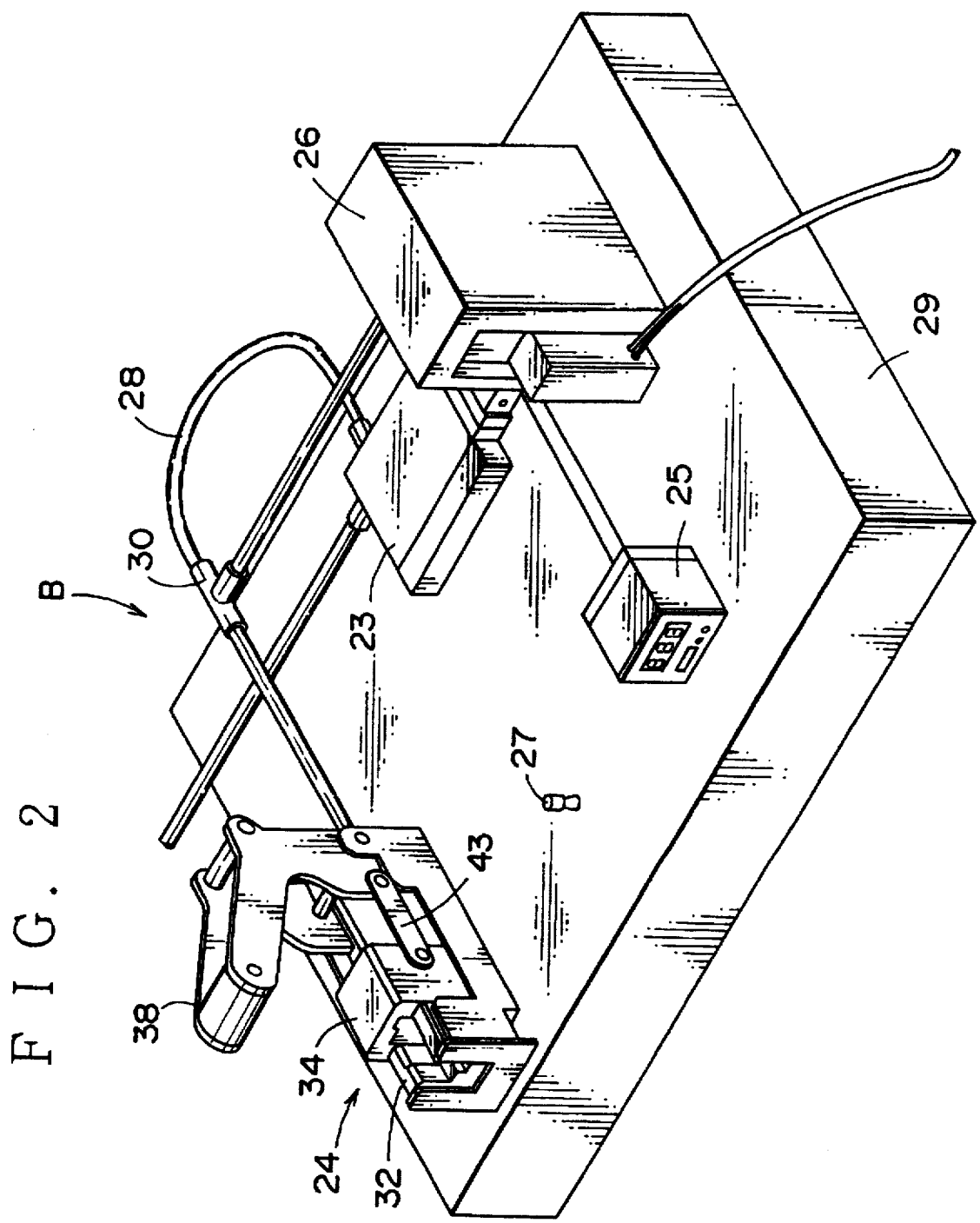
FIG. 2 is a perspective view of a waterproofness checking apparatus according to one embodiment of this invention.

FIG. 2 is a perspective view of an apparatus B for checking the waterproofness of a waterproof connector A, which implements the system block diagram in FIG. 1. In this figure, like parts or elements as in FIG. 1 are denoted by like reference characters.

Designated at 29 in FIG. 2 is a base plate of light-weight material such as synthetic-resin, aluminum or the like. At the front half of the base plate 29, a waterproofness checking jig 24 is arranged on one side (left side in the figure), a pressure sensor 25 on the other side, and a switch 27 at an intermediate position therebetween. At the rear half of the base plate 29, i.e., in back of the switch 27 and the pressure sensor 25, there are respectively arranged an ejector 23 and a power source 26. An air pipeway 28 on the depressurization side of the ejector 23 is branched through a coupling 30 to be connected to the waterproofness checking jig 24 and to the pressure sensor 25. With the aid of a not-shown electric wiring on the underside of the base plate 29, if the switch 27 is turned on, a change valve (not-shown) in the ejector 23 is operated to depressurize the waterproofness checking jig 24. The reduced pressure in the jig 24 is transmitted to the pressure sensor 25 to be indicated and further to be compared with the reference pressure. The change valve also serves to keep the interior of the checking jig 24 in the depressurized state, though any other means is employable so long as capable of performing the same function.

Figure 4:
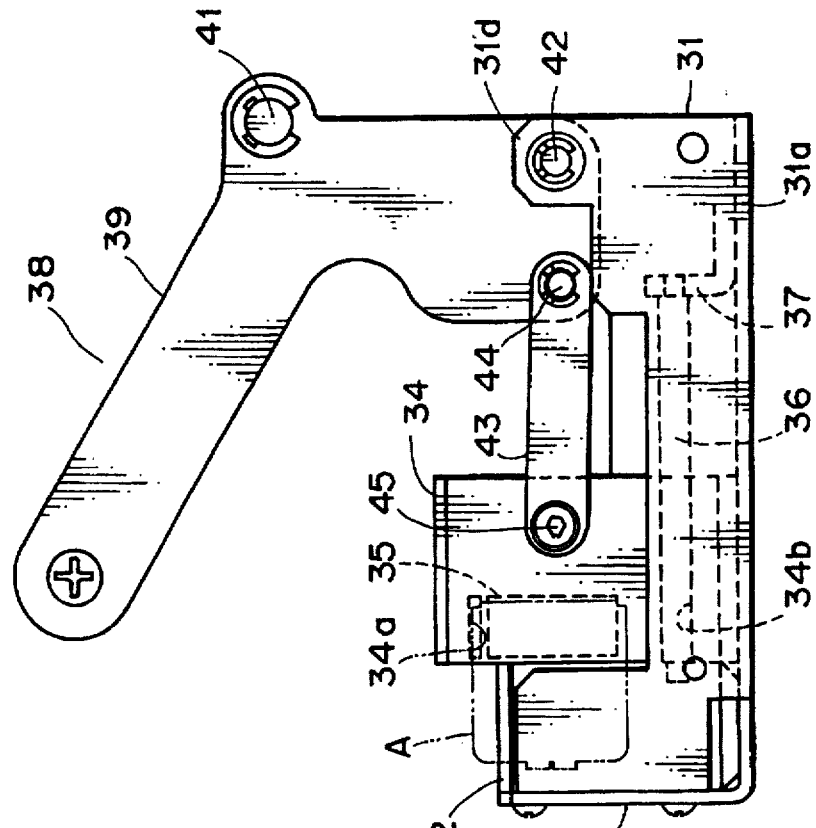
FIG. 4 is a side view of the waterproofness checking jig of FIG. 3.
Figure 3:
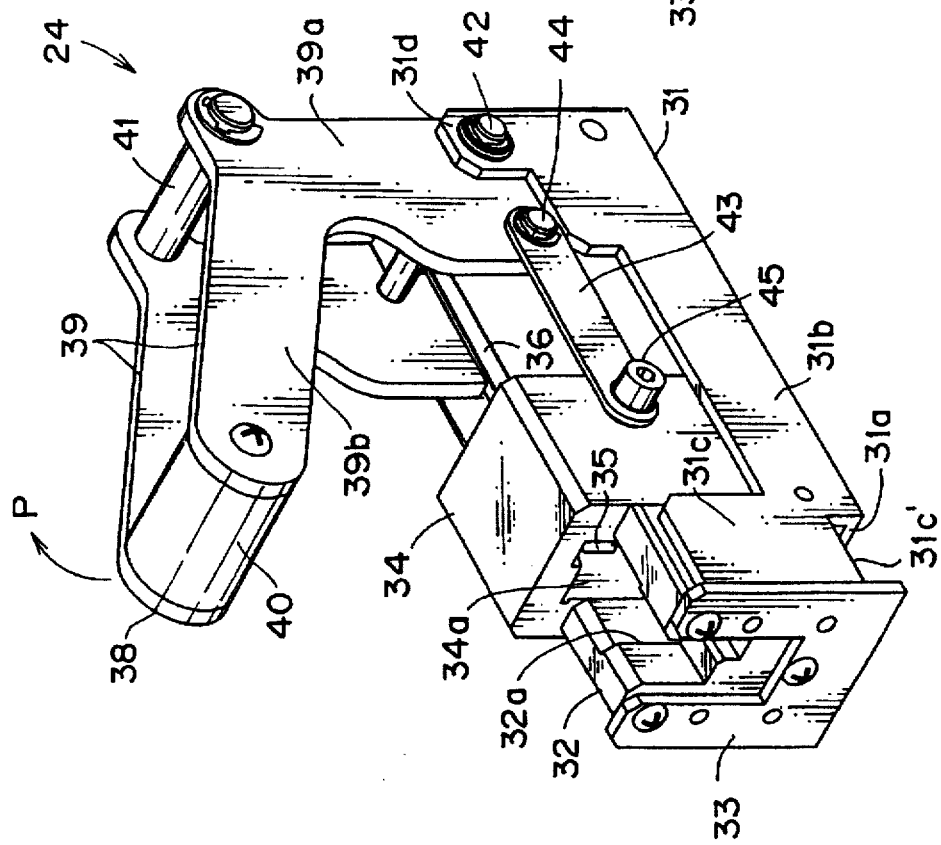
FIG. 3 is a perspective view of a waterproofness checking jig used in the apparatus of FIG. 2.

Referring to FIGS. 3 and 4, the waterproofness checking jig 24 comprises a framing 31, a sub-holding block 32 provided at one end thereof, a slidable connector-holding block 34 in opposition to the block 32, and a lever 38 with a toggle mechanism which moves the connector-holding block 34 forwardly and backwardly.

The framing 31 is trough-shaped and comprises a bottom plate 31a and lateral plates 31b on opposite sides of the bottom plate 31a. Each lateral plate 31b is at the front end portion formed with a notch 31c' and above the notch 31c' formed with an upwardly-extended connector support plate 31c. The sub-holding block 32 is interposed between the opposite connector support plates 31c.

The sub-holding block 32 is for supporting the terminal insertion side of the waterproof connector A, i.e., the side from which terminals are inserted. The sub-holding block 32 is provided in a depressed shape opened fowardly and rearwardly as well as upwardly, and has an inner step 32a complementary to an external shape of the connector housing to be held (housing body 1, waterproofing hood 6 in FIG. 8 or the like). The sub-holding block 32 between the connector support plates 31c, 31c is securely screwed to the framing 31 along with a depressed keep plate 33.

The connector-holding block 34 is for holding in a watertight manner the fitting side of the waterproof connector A with a mating connector and has at the front a recessed portion 34a for receiving the fitting side of the connector A, in which recessed portion is provided an elastic packing 35 for close contact with the fitting surface of the waterproof connector A (the end surface 1a of the housing body 1 in FIG. 8) and to which recessed portion is connected to the pipeway 28 on the depressurization side as mentioned above.

The connector-holding block 34 is provided slidable between the sub-holding block 32 and the other end of the framing 31. For this purpose, the connector-holding block 34 is at a lower portion thereof provided with a pair of guide holes 34b, and guide rods 38 which extend through the guide holes 34b are at one end fixed to the sub-holding block 32 and at the other end fixed to a rod stopper 37 provided at the bottom plate 31a of the framing 31.

The lever 38 comprises a pair of opposed lever plates 39, 39 connected to each other to form a gate-like shape. Each lever plate 39 comprises an upright base portion 39a of large width and an operating portion 39b obliquely upwardly extending from the base portion 39a as an integral part thereof. The lever plates 39, 39 are at the upper end and an intermediate portion, i.e., at both ends of their operating portions 39b connected to each other by means of a spacer 40 and a joint rod 41.

The upright base portions 39a are at the lower, rear end thereof rotatably connected through a pin 42 to tabs 31d provided at the rear end of the lateral plates 31b of the framing 31. Links 43 are at one end connected through pins 44 to the lower, front end of the upright base portions 39a and at the other end connected through stud bushes 45 to side walls of the connector-holding block 34.

A toggle mechanism is employed for the lever 38, the links 43 and the connector-holding block 34, in which the pins 44 are slightly lowered from the position whereat the pins 44 are aligned with the pin 42 and stud bushes 45 so that the waterproof connector A is held and locked in a watertight manner between the sub-holding block 32 and the connector-holding block 34.

The method of checking the waterproofness of the waterproof connector A with the waterproofness checking apparatus B having the waterproofness checking jig 24 will now be described.

First, referring to FIG. 3, the lever 38 is rotated upwardly as indicated by an arrow P to part the connector-holding block 34 from the sub-holding block 32.

The terminal-insertion side of the waterproof connector A is then fitted in the sub-holding block 32 from above. Thereafter, the lever 38 is rotated in the direction opposite to the arrow P to cause the connector-holding block 34 to approach the sub-holding block 32 so that the fitting side of the waterproof connector A enters the recessed portion 34a to bring its fitting surface 1a into close contact with the elastic packing 35. If the lever 38 is further rotated downwardly until the pins 44 are located slightly below the center line passing through the pin 42 and the stud bush 45, the lever 38 is locked due to the toggle mechanism mentioned above. The waterproof connector A is thus held in a watertight manner by the waterproofness checking jig 24.

After the waterproof connector A has thus been set on the waterproofness checking jig 24, the switch 27 in FIG. 2 is turned on to operate the ejector 23 and depressurize the inside of the waterproof connector A.

As soon as the depressurization is started, the pressure sensor 25 displays the value of the pressure inside the waterproof connector A, which becomes definite in a short period of time.

In other words, if the waterproof connector A is free of leakage, the pressure coincides with the reference pressure stored in advance in the pressure sensor 25. If there is leakage, as if there is, for example, a pinhole in the housing body 1 of the waterproofing rubber stopper 5, the pressure inside the waterproof connector A does not reach a predetermined reduced pressure, and the buzzer is sounded indicating faulty on comparison with the reference pressure.

Thus, the setting of the waterproof connector A on the waterproofness checking jig 24 and its checking for waterproofness can be very easily and quickly done.

Further, since the inside of the waterproof connectors A is depressurized by the ejectors 23, there is no fear that the waterproofing rubber stopper 5 may pop out. Rather, if the rubber stopper 5 is inserted incomplete, it is pulled deeper inside the connectors housing by the depressurization attraction to be fully inserted.

Further, if necessary, by so arranging that the waterproof connector A may be pressurized by operating the switch 27 and closing (or opening) the change valve of the ejector 23, it becomes possible to check for waterproofness based on a positive pressure.

Figure 5:
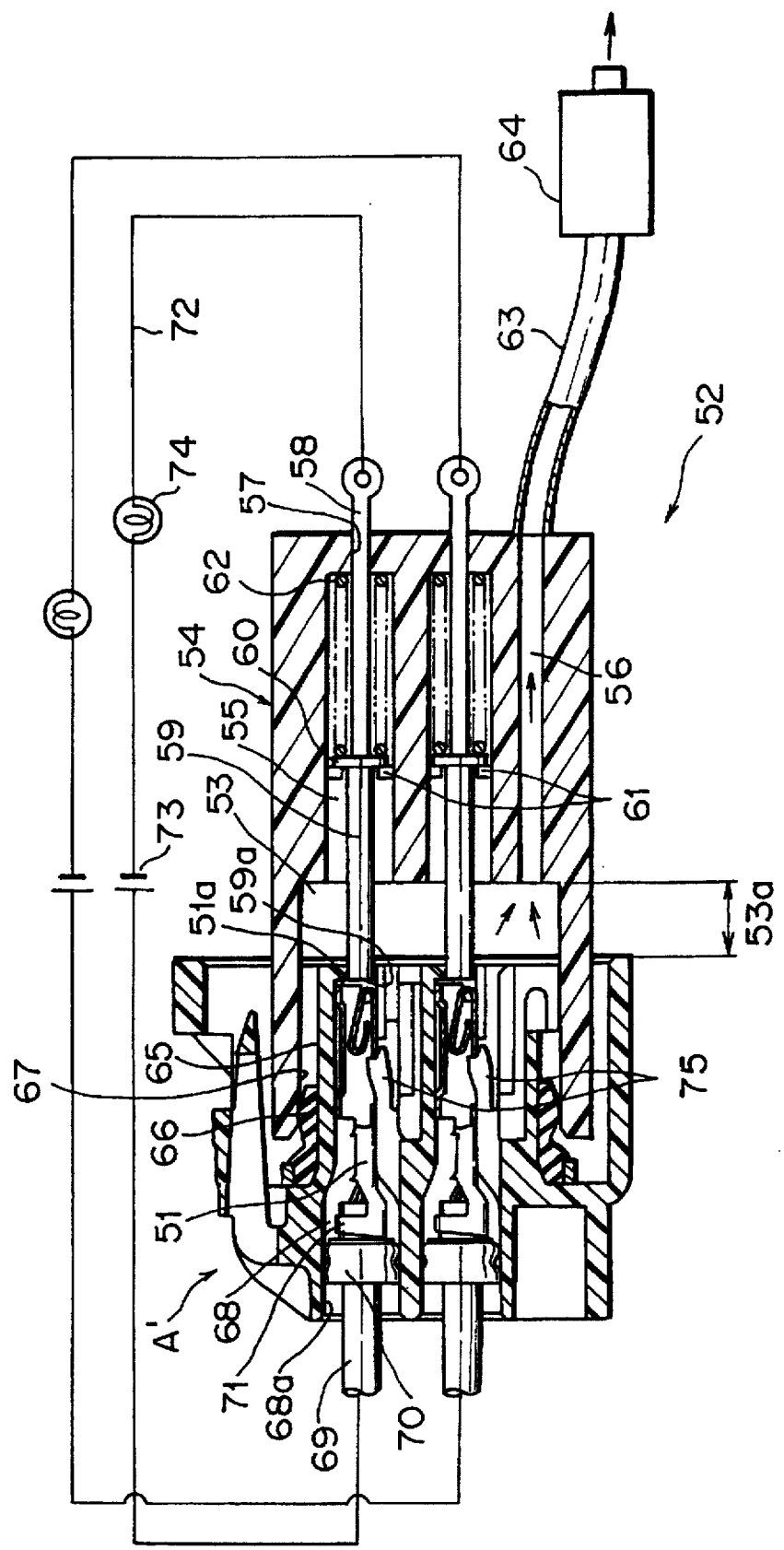
FIG. 5 is a longitudinal sectional view of the waterproofness checking apparatus.

FIG. 5 shows a structure in which the depressurization of a waterproofness checking apparatus is used to prevent incomplete insertion of a female terminal 51 into a waterproof connector A'.

The waterproofness checking apparatus 52 includes a connector-holding block 54 with a fitting room 53 into which the waterproof connector A' is fitted. The connector-holding block 54, as described in connection with FIG. 3, is a part of a waterproofness checking jig, and a view showing the entire checking jig is omitted. The connector-holding block 54 is formed with a plurality of conductive-pin receiving holes 55 and a suction hole 56, all of which extend parallel to each other and are connected to the fitting room 53. A smaller diameter portion 57 is extended from the end of each conductive pin receiving hole 55, into which smaller diameter portion is inserted and fixed a terminal pin 58. Each conductive pin 59 is at the rear end provided with a flange portion 60 for abutment against a stopper 61 provided at an intermediate portion of the related conductive pin receiving hole 55.

The terminal pin 58 is capable of advancing into the conductive pin 59, and a coil spring 62 is provided between the flange portion 60 of the conductive pin 59 and the end of the receiving hole 55 to urge the conductive pin 59 towards the fitting room 53. The front half of the conductive pin 59 projects into the fitting room 53 to bring its front end 59a into contact with the front end 51a of the female terminal 51 fully inserted into the waterproof connector A'. The suction hole 56 opens at the front end to the fitting room 53 and at the rear end connected to an external pipeway 63 through welding or the like, which external pipeway is in turn connected to a depressurizing compressor 64.

Into the fitting room 53 is engaged the housing body 65 of the waterproof connector A' which contains therein female terminals 51. In the state in FIG. 5, the housing body 65 is fully inserted into a predetermined position in the fitting room 53. A waterproofing elastic packing 66 is fitted around the housing body 65 at the proximal side thereof with a lip portion closely contacting the inner surface 67 at the front end of the fitting room 53. An insulated wire 69 is attached to the female terminal 51 accommodated in the terminal accommodating chamber (terminal accommodating hole) in the housing body 65. The insulated wire 69 has a waterproofing rubber stopper 70 fitted thereover which closely contacts the inner surface of a larger-diameter portion at the rear portion of the terminal accommodating chamber 68. A crimp piece 71 of the female terminal 51 is crimped to hold the waterproofing rubber stopper 70 and the wire 69 together as an integral unit. The inside of the fitting room 53 is maintained watertight by means of the elastic packing 66 and the waterproofing rubber stopper 70.

If the waterproof connector A' is fully engaged in the fitting room 53 as shown in FIG. 5 (no further insertion of the connector A' into the fitting room 53 is possible), an air gap 53a of some size is formed between the front end of the connector A' and the bottom wall of the fitting room 53, through which air gap and through the suction hole 56 the terminal-accommodating-chambers 68 in the connector A' are simultaneously depressurized. A lead wire 72 is connected on one hand to the insulated wire 69 of the terminal 51 and on the other to the terminal pin 58, and has a power source 73 and a check lamp 74 connected at intermediate positions thereof. Each female terminal 51 is locked in position in the terminal accommodating chamber 68 by a resilient locking lance 75 provided in the housing body 67.

If in this instance the female terminal 51 is inserted incomplete, since the advancement of the conductive pin 59 is limited by the stopper 61, the tip end 59a of the conductive pin 59 does not come into contact with the front end 51a of the female terminal 51, and faulty continuity is detected. On the other hand, during the depressurization of the fitting room 53 and the connector A' for checking the waterproofness of the connector, which is effected by the compressor 64 through the suction hole 56, the waterproofing rubber stopper 70 and thus the female terminal 51 are pulled forwardly (deeper in the terminal insertion direction) to bring the female terminal 51 into its fully-inserted position. Owing to the above, the terminal inserted incomplete is corrected to be fully inserted, with the result that the female terminal 51 and the conductive pin 59 are brought into contact with each other to provide good continuity, and that the slipping-off of an incompletely-inserted terminal is prevented.

Incidentally, the stopper 61 may be omitted in FIG. 5. In this case, continuity is made between the female terminal 51 and the conductive pin 59 even if the former is inserted incomplete, and good conductivity will be displayed. An incompletely-inserted terminal is sucked into its fully-inserted position no matter what the display may be. Further, a structure may be employed in which, with the stopper 61 maintained as it is, a gap is formed between the rear end 60 of the conductive pin 59 and the front end of the terminal pin 58, and the tip end 59a of the conductive pin 59 is contactable with the female terminal 51 when the latter is inserted so that the full insertion of the female terminal 51 brings the conductive pin 59 into contact with the terminal pin 58. Alternatively, a stopper may be provided towards the front end of the conductive pin 59 so as to abut against the front end of the connector housing 65.

Figure 6:
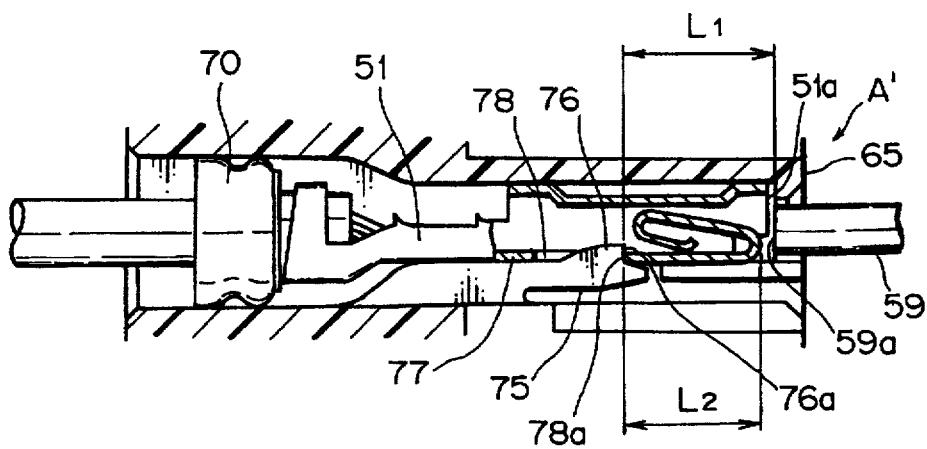
FIG. 6 is a longitudinal sectional view of an essential portion of FIG. 5, in the state where the waterproof connector is held in a watertight manner.
Figure 7:
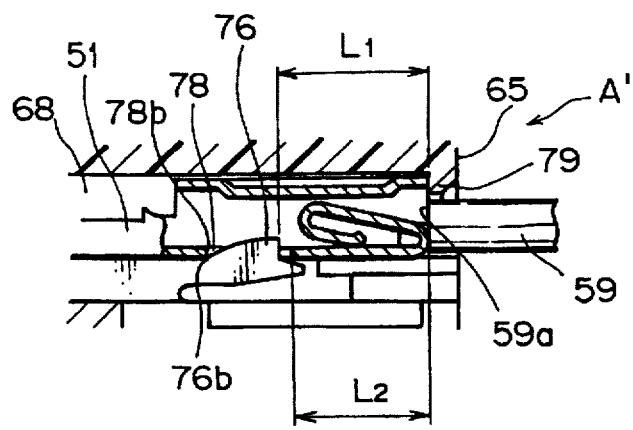
FIG. 7 is a longitudinal sectional view of an essential portion of FIG. 5, in the state where the inside of the waterproof connector is depressurized.
Figure 10:
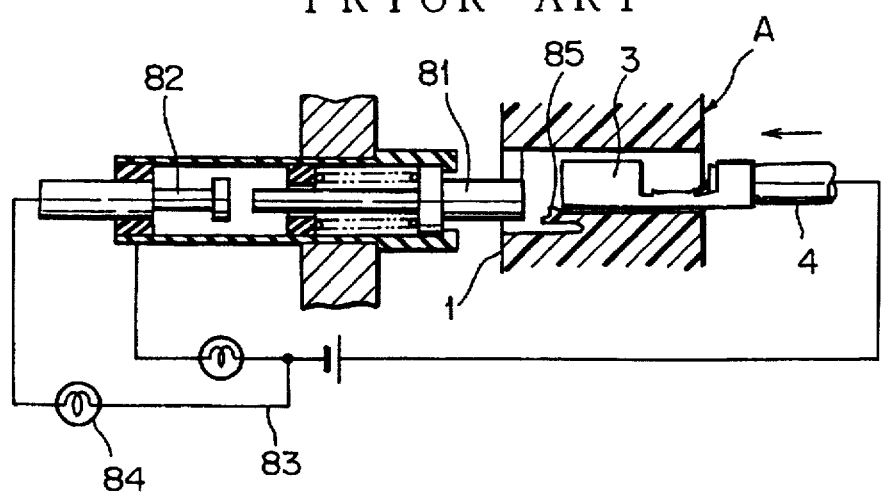
FIG. 10 is a longitudinal sectional view showing a conventional method of checking a connector for continuity.

FIGS. 6 and 7 show the state in which the female terminal 51 is locked in position in the waterproof connector A' by the resilient locking lance 75 of the connector housing 65. In this embodiment, to avoid the situation in which the engagement hole 78 in the base plate 77 of the female terminal 51 stops just in front of the engagement projection 78 of the resilient locking lance 75 to remain unengaged with the latter, the positioning of the connector A' in the waterproofness checking jig is such that at the initial stage of full insertion of the terminal in which the front end 76a of the engagement projection 76 abuts against the front end 78a of the engagement hole 78 as shown in FIG. 6, the front end 51a of the female terminal 51 does not contact the front end 59a of the conductive pin 59. In other words, the distance L1 between the front end 59a of the conductive pin 59 and the front end 76a of the engagement projection 76 is set larger than the distance L2 between the front end 51a of the female terminal 51 and the front end 78a of the engagement hole 78, and the length of the engagement hole 78 is set larger than the length of the engagement projection 76.

With the construction as mentioned above, when the connector A' is depressurized for the checking for waterproofness, the female terminal 51, along with the waterproofing rubber stopper 70, is attracted and moved in the terminal insertion direction by the distance corresponding to the longitudinal play between the engagement hole 78 and the engagement projection 76. With the rear end (sloping portion) 76b of the engagement projection 76 abutting against the rear end 78b of the engagement hole 78, the front end 51a of the female terminal 51 contacts the front end 59a of the conductive pin 59, and good continuity is indicated.

By the suction operation of the compressor 64, the female terminal 51 is capable of moving forwardly along the rear end (sloping portion) 76b of the engagement projection 76 until the front end 51a of the female terminal 51 abuts against a stop wall 79 at the front end of the terminal-accommodating chamber 68 in the housing body 65, at which time the front end 51a of the female terminal 51 contacts the conductive pin 59 without fail, and the engagement projection 76 engages in the engagement hole 78. Owing to the above, if there are variations in longitudinal sizes of locking projections 76 and engagement holes 78, it is prevented that the engagement projection 76 stops just in front of the engagement hole 78 to remain unengaged with the latter, while enabling detection of continuity.

What is claimed is:

1. A method of checking a waterproof connector for waterproofness comprising a connector housing with a terminal-accommodating chamber formed therein into which a terminal attached to an end of an insulated wire has been inserted from a first side of said connector housing, said terminal-accommodating chamber having been sealed by a waterproofing rubber stopper through which said insulated wire passes, said method comprising the steps of:

engaging a connector-holding block in a watertight manner with a second side of said connector housing at which said connector is fitted with a mating connector; and depressurizing an interior of said connector through said connector-holding block, wherein during said depressurization of the interior of said connector, said terminal, if inserted incomplete, is sucked in one piece with said waterproofing rubber stopper into a fully-inserted position.

2. An apparatus for checking a waterproof connector for waterproofness comprising a connector housing with a terminal-accommodating chamber formed therein into which a terminal attached to an end of an insulated wire has been inserted from a first side of said connector housing, said terminal-accommodating chamber having been sealed by a waterproofing rubber stopper through which said insulated wire passes, said apparatus comprising:

a waterproofness checking jig having a connector-holding block for engaging in a watertight manner with a second side of said connector at which said connector is fitted with a mating connector; and means for depressurizing an interior of said connector through said connector-holding block and means for holding the interior of said connector in the depressurized state, wherein during depressurization of the interior of said connector, said terminal, if inserted incompleted, is sucked in one piece with said waterproofing rubber stopper into a fully-inserted position.

3. An apparatus according to claim 2, wherein said connector-holding block is provided with a conductive pin for contact with said terminal to check said terminal for continuity, and wherein in the state where said connector-holding block engages in a watertight manner with said connector and where the depressurization of said connector has not yet been effected, said terminal is located forwardly of said conductive pin and remains not contacted with said conductive pin within limits of an engagement play between said terminal and a resilient locking lance provided in said connector housing for locking said terminal, and during the depressurization of the interior of said connector, said terminal is brought into contact with said conductive pin.

4. An apparatus according to claim 3, wherein a distance from said conductive pin to an engagement projection of said resilient locking lance is set larger than a distance from a front end of said terminal to an engagement hole in said terminal in which said engagement projection engages.

* * * * *